United States Patent
Ryu

(10) Patent No.: US 7,515,086 B2
(45) Date of Patent: Apr. 7, 2009

(54) PIPELINED ANALOG-TO-DIGITAL CONVERTER AND METHOD OF ANALOG-TO-DIGITAL CONVERSION

(75) Inventor: Seung-Tak Ryu, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 11/879,675

(22) Filed: Jul. 18, 2007

(65) Prior Publication Data

US 2008/0018514 A1    Jan. 24, 2008

(30) Foreign Application Priority Data

Jul. 19, 2006    (KR) .................. 10-2006-0067333

(51) Int. Cl.
  *H03M 1/38*    (2006.01)
(52) U.S. Cl. .................. 341/161; 341/144; 341/155
(58) Field of Classification Search .................. 341/118, 341/155, 156, 159, 161
  See application file for complete search history.

(56) References Cited

U.S. PATENT DOCUMENTS 6,288,662 B1    9/2001    Yoshizawa
6,518,898 B1 *  2/2003    Choksi .................. 341/118
7,081,845 B2 *  7/2006    Hales et al. .................. 341/158
2005/0219097 A1 * 10/2005    Atriss et al. .................. 341/144

FOREIGN PATENT DOCUMENTS

| JP | 11-340830 | 12/1999 |
| JP | 2000-22541 | 1/2000 |
| JP | 2004-260263 | 9/2004 |
| JP | 2005-277943 | 10/2005 |

* cited by examiner

*Primary Examiner*—Brian Young
(74) *Attorney, Agent, or Firm*—Mills & Onello LLP

(57) ABSTRACT

A pipelined analog-to-digital converter (ADC) has a multistage structure, and the pipelined ADC includes a plurality of stages that form the multistage structure. Each of the stages includes a sample-and-hold (S/H) circuit, a flash ADC, and a digital-to-analog converter (DAC). The S/H circuit converts an analog input signal to a digital signal. The flash ADC detects a digital bit corresponding to the analog input signal. The DAC converts the digital signal to an analog signal, and amplifies a residue signal, which is a difference between the input analog signal and the converted analog signal, that is provided as an analog input signal of the next stage.

20 Claims, 12 Drawing Sheets

PIPELINED ANALOG-TO-DIGITAL CONVERTER AND METHOD OF ANALOG-TO-DIGITAL CONVERSION

CROSS-REFERENCE TO RELATED APPLICATIONS

This application claims priority under 35 USC § 119 to Korean Patent Application No. 2006-67333, filed on Jul. 19, 2006 in the Korean Intellectual Property Office (KIPO), the disclosure of which is incorporated herein in its entirety by reference.

BACKGROUND OF THE INVENTION

1. Field of the Invention

The present invention relates to an analog-to-digital converter (ADC), and more particularly, to a pipelined ADC, and a method of analog-to-digital conversion.

2. Description of the Related Art

In general, a pipelined analog-to-digital converter (ADC) is a multi-step quantizer, in which a plurality of ADCs are cascade-coupled with one another, and in which each of the ADCs has a relatively low resolution and the same or similar configurations with one another.

FIG. 1 is a block diagram illustrating a conventional pipelined ADC. Referring to FIG. 1, a conventional pipelined ADC 100 includes a plurality of n stages STG1 through STGn. Each stage STGi includes a sample-and-hold (S/H) circuit 110, an ADC 120, a digital-to-analog converter (DAC) 130, a subtractor 140, a residue amplifier 150 and a reference voltage driver 200. The S/H circuit 110 samples an analog input signal. The ADC 120 converts the analog input signal to a digital code having a low resolution. The DAC 130 and the subtractor 140 obtain a difference between the analog input signal and an analog signal corresponding to the digital code of the ADC 120. The residue amplifier 150 has a gain of $2^{Bi-1}$. Bi denotes a resolution of the stage STG1, and Bi is generally designed as ½ for correcting ADC errors generated in each of the stages, and referred to as a digital correction logic (DCL).

A building block including the S/H circuit 110, the DAC 130, and the residue amplifier 150 is referred to as a multiplying DAC (MDAC) 160. The MDAC is an essential block for the pipelined ADC.

A precise reference voltage is required for driving capacitors in each of the stages so that the MDAC 160 and the ADC 120 operate precisely. A unity-feedback buffer is used for obtaining the precise reference voltage.

FIG. 2 is a circuit diagram illustrating a reference voltage driver 200 employing a unity-feedback buffer for using the precise reference voltage.

Referring to FIG. 2, a reference voltage driver 200 includes a plurality of unity-feedback buffers 211, 213 and 215, a plurality of metal-oxide semiconductor (MOS) amplifiers 221, 223, and 225, a plurality of resistors R1, R2 and R3, and capacitors Cdcpl. The reference voltage driver 200 is connected externally via the capacitors Cdcpl for preventing fluctuation of the reference voltage so that the reference voltage is stably provided.

The stability of the reference voltage directly affects the performance of the pipelined ADC 100, and thus the reference voltage is required to be recovered at every analog-to-digital converting cycle. Therefore, the reference voltage driver 200 occupies a large size and consumes a lot of power, because the driving capacity and bandwidth of the unity-feedback buffers 211, 213 and 215 have to be sufficiently increased. In addition, the reference voltage of the reference voltage driver 200 cannot be modified or is required to be modified externally when the power supply voltage is required to be modified, and thus the reference voltage driver 200 has certain limitations when attempting to use a full dynamic range without using an external controller.

SUMMARY OF THE INVENTION

Accordingly, embodiments of the present invention are provided to substantially obviate one or more problems associated with the limitations and disadvantages of the related art.

Some embodiments of the present invention provide a pipelined ADC that can provide a reference voltage from a power supply voltage.

Some embodiments of the present invention provide a method of analog-to-digital conversion that may provide a reference voltage from a power supply voltage of a pipelined analog-to-digital converter (ADC).

In one aspect, a digital-to-analog converter (DAC) includes an amplifier, a first switched capacitor circuit, and a second switched capacitor circuit. Each of the first and second switched capacitor circuits includes a feedback capacitor having a unit capacitance, a first capacitor that has a first capacitance, and includes a first common terminal coupled to a common terminal of the feedback capacitor and one of the differential input terminals, a second capacitor that has a second capacitance, and includes a second common terminal coupled to the common terminal of the feedback capacitor and one of the differential input terminals, and a plurality of switches. The first capacitance corresponds to X times the unit capacitance, and the second capacitance corresponds to (1−X) times the unit capacitance. Here, X is a real number that is greater than 0 and less than 1. The plurality of switches connect input terminals of all of the capacitors to an analog differential input signal, and connect the differential input terminals to a common mode voltage during a first phase of a clock. The plurality of switches disconnect the common mode voltage from the differential input terminals, connect an input terminal of the feedback capacitor to one of the differential output terminals, connect a first input terminal of the first capacitor to one of first, second and third reference voltages, and connect a second input terminal of the second capacitor to the second reference voltage during a second phase of the clock.

In some embodiments, the first, second, and third reference voltages may be driven from a power supply source. The first reference voltage may correspond to a power supply voltage, the second reference voltage may correspond to a ground voltage, and the third reference voltage may range from the second reference voltage and the first reference voltage. The common mode voltage may correspond to the second reference voltage. The differential outputs of the amplifier may be connected to each other during the first phase of the clock.

In another aspect, a flash ADC includes a comparator including a first input terminal coupled to a ground voltage and a capacitor circuit coupled to a second input terminal of the comparator. The capacitor circuit includes a first sampling capacitor having a first common terminal coupled to the second input terminal of the comparator, a second sampling capacitor having a second common terminal coupled to the second input terminal of the comparator and to the first common terminal of the first sampling capacitor, and a plurality of switches that perform switching operations for comparing an analog input signal with a reference voltage after a power supply voltage is stored in the first sampling capacitor.

In some embodiments, the plurality of switches may connect the power supply voltage to a first input terminal of the first sampling capacitor, may connect the ground voltage to a second input terminal of the second sampling capacitor, and may connect the power supply voltage in the first sampling capacitor by connecting the first and second input terminals of the comparator with each other. The plurality of switches may compare the analog input signal with the reference voltage by connecting the analog input signal to the first input terminal of the first sampling capacitor and the second input terminal of the second sampling capacitor.

In some embodiments, the reference voltage may have a voltage level corresponding to A/(A+B) times a voltage level of the power supply voltage when the first sampling capacitor has A times a unit capacitance, and the second sampling capacitor may has B times the unit capacitance. Here, A and B are positive real numbers.

In another aspect, a pipelined ADC has a multistage structure, and the pipelined ADC includes a plurality of stages that form the multistage structure. Each of the stages includes a sample-and-hold (S/H) circuit, a flash ADC, and a DAC. The S/H circuit converts an analog input signal to a digital signal. The flash ADC detects a digital bit corresponding to the analog input signal. The DAC converts the digital signal to an analog signal, and amplifies a residue signal, which is a difference between the input analog signal and the converted analog signal, that is provided as an analog input signal of the next stage. The DAC includes an amplifier, a first switched capacitor circuit, and a second switched capacitor circuit. Each of the first and second switched capacitor circuits includes a feedback capacitor having a unit capacitance, a first capacitor that has a first capacitance, and includes a first common terminal coupled to a common terminal of the feedback capacitor and one of the differential input terminals, a second capacitor that has a second capacitance, and includes a second common terminal coupled to the common terminal of the feedback capacitor and one of the differential input terminals, and a plurality of switches. The first capacitance corresponds to X times the unit capacitance, and the second capacitance corresponds to (1−X) times the unit capacitance. Here, X is a real number that is greater than 0 and less than 1. The plurality of switches connect input terminals of all of the capacitors to an analog differential input signal, and connect the differential input terminals to a common mode voltage during a first phase of a clock. The plurality of switches disconnect the common mode voltage from the differential input terminals, connect an input terminal of the feedback capacitor to one of the differential output terminals, connect a first input terminal of the first capacitor to one of first, second and third reference voltages, and connect a second input terminal of the second capacitor to the second reference voltage.

In some embodiments, the pipelined ADC may further include a digital correction logic that corrects errors of the digital bits output from each of the plurality of stages.

In another aspect, an analog-to-digital conversion method includes receiving an analog input signal, storing the analog input signal in a plurality of sub-capacitors that include a feedback capacitor, a first capacitor and a second capacitor, detecting a digital bit corresponding to the analog input signal, converting the digital signal to an analog signal, and amplifying a difference between the input analog signal and the converted analog signal. The feedback capacitor has a unit capacitance, the first capacitor has X times the unit capacitance, and the second capacitor has (1−X) times the unit capacitance. Here, X is a real number that is greater than 0 and less than 1.

In some embodiments, detecting the digital bit may include sampling a reference voltage from a power supply voltage and a ground voltage and comparing the sampled reference voltage and the analog input signal.

Therefore the DAC, the flash ADC, the pipelined ADC, and the method of analog-to-digital conversion according to example embodiments of the present invention may reduce chip size and power consumption because a necessary reference voltage is supplied internally.

DESCRIPTION OF THE EMBODIMENTS

Figure 1:
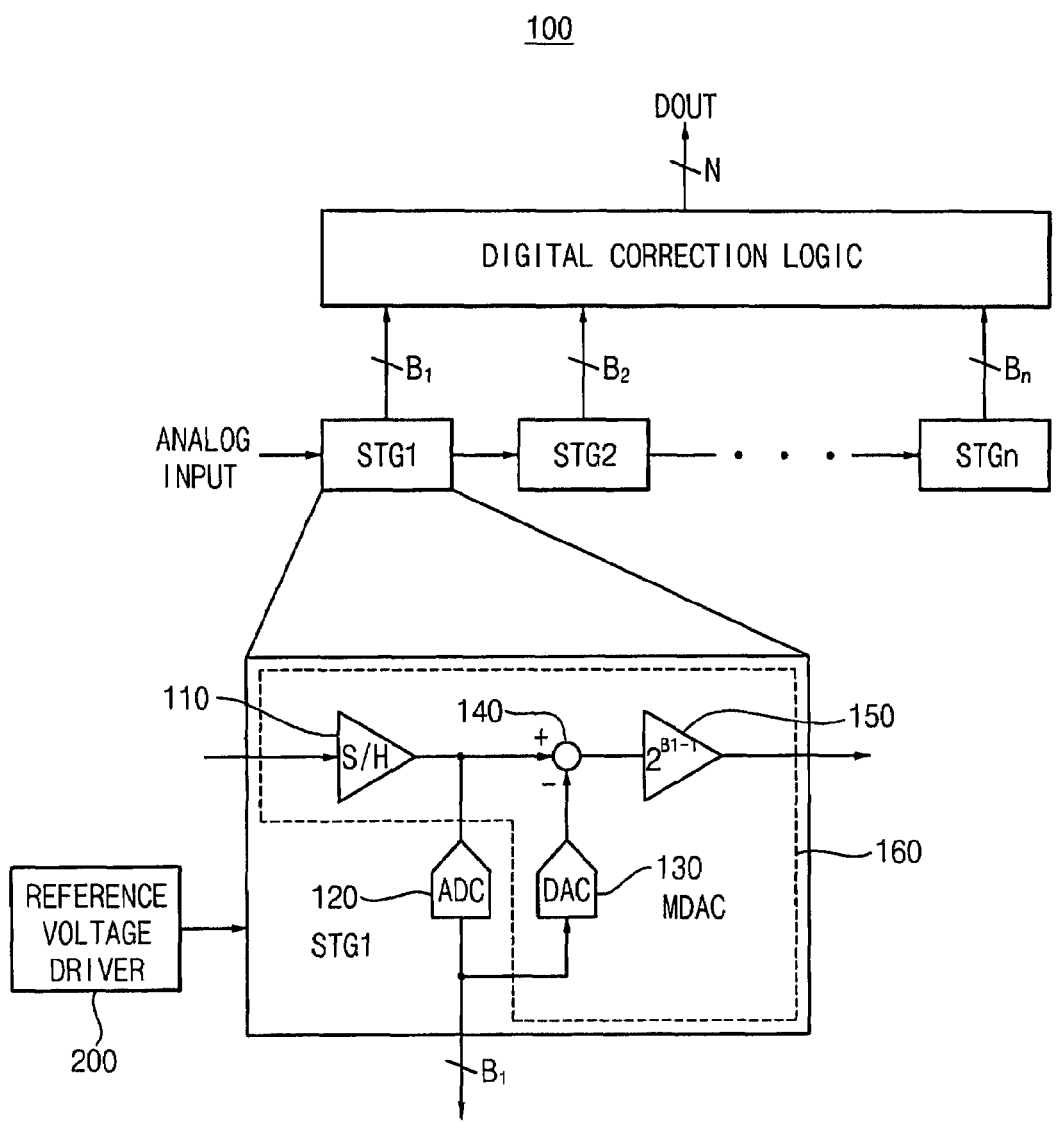
FIG. 1 is a block diagram illustrating a conventional analog-to-digital converter (ADC).
Figure 2:
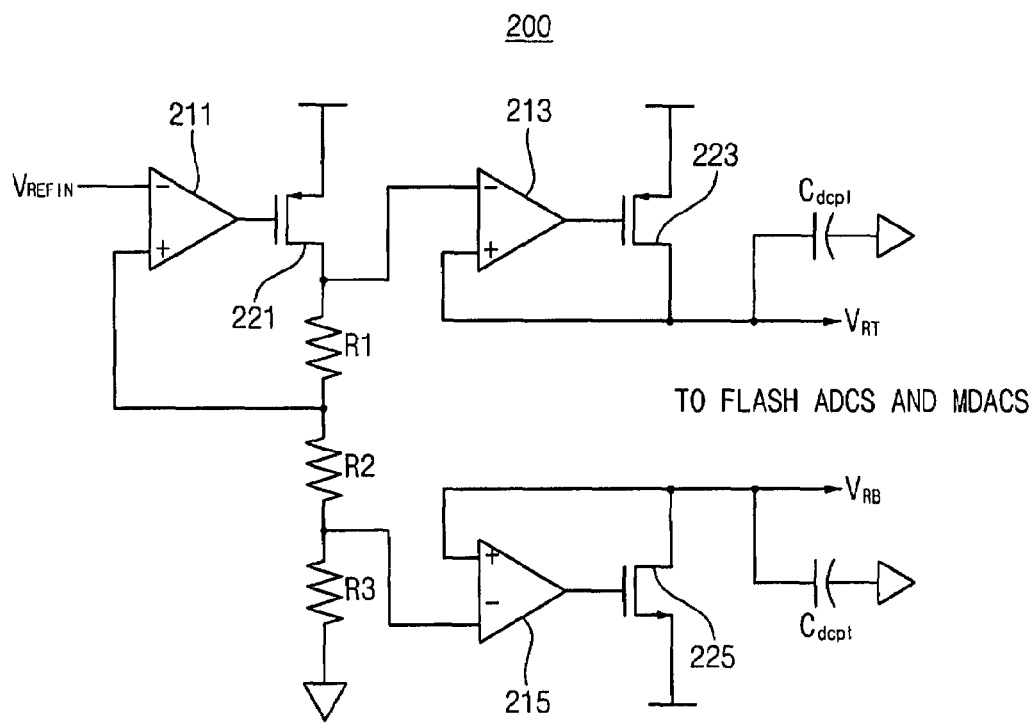
FIG. 2 is a circuit diagram illustrating a conventional reference voltage driver employing a unity-feedback buffer for using the precise reference voltage.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
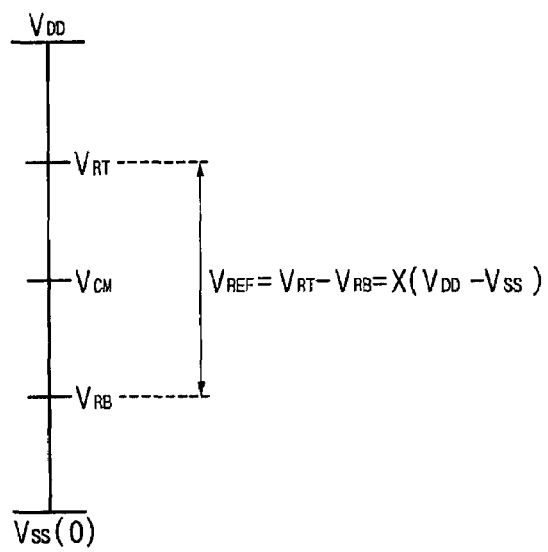
FIG. 3 is a diagram illustrating a relation between a power supply voltage and a reference voltage.

FIG. 3 is a diagram illustrating a relationship between a power supply voltage and a reference voltage.

Reference voltages such as VRT, VCM and VRB that are used in the pipelined analog-to-digital converter (ADC) range from a ground voltage VSS to a power supply voltage VDD. The common-mode level voltage VCM is defined as an average of a top reference voltage (VRT) and a bottom reference voltage (VRB). The top reference voltage VRT and the bottom reference voltage VRB are symmetrically coupled to positive and negative input terminals, respectively, in a general differential system. A differential reference voltage VREF is may be defined as VREF=VRT−VRB. A ratio X between VREF and (VDD−VSS) may be formulated according to the following relationship:

$$\text{VREF} = \text{VRT} - \text{VRB} = X(\text{VDD} - \text{VSS}) \qquad \text{[Equation 1]}$$

Figure 4:
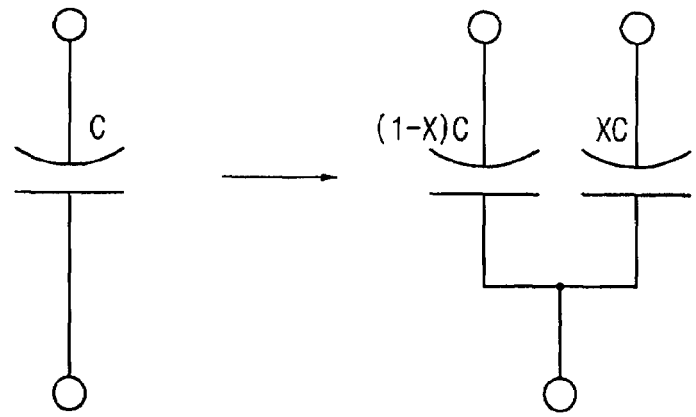
FIG. 4 is a diagram illustrating a method of generating a reference voltage from a power supply voltage.

FIG. 4 is a circuit diagram illustrating a method of generating a reference voltage from a power supply voltage.

Referring to FIG. 4, a unit capacitor having a unit capacitance C is divided into a first capacitor having a capacitance XC and a second capacitor having a capacitance (1−X)C, and the reference voltage may be generated from the power supply voltage by employing the first and second capacitors in a multiplying digital-to-analog converter (MDAC).

Figure 5A:
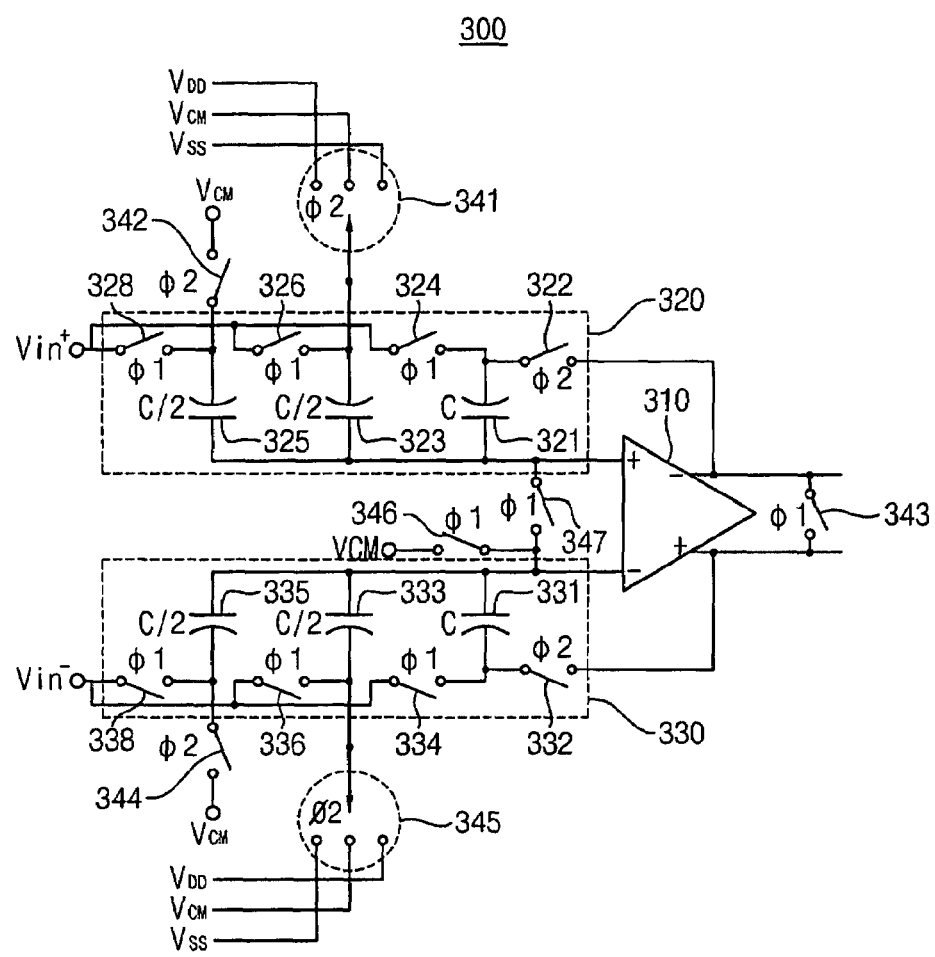
FIGS. 5A, 5B and 5C are circuit diagrams illustrating a 1.5 b multiplying digital-to-analog converter (MDAC) without a reference voltage generator according to an example embodiment of the present invention.
Figure 5B:
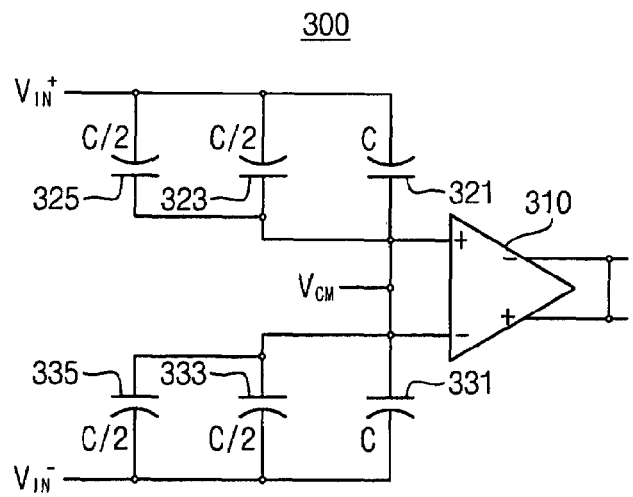
Figure 5C:
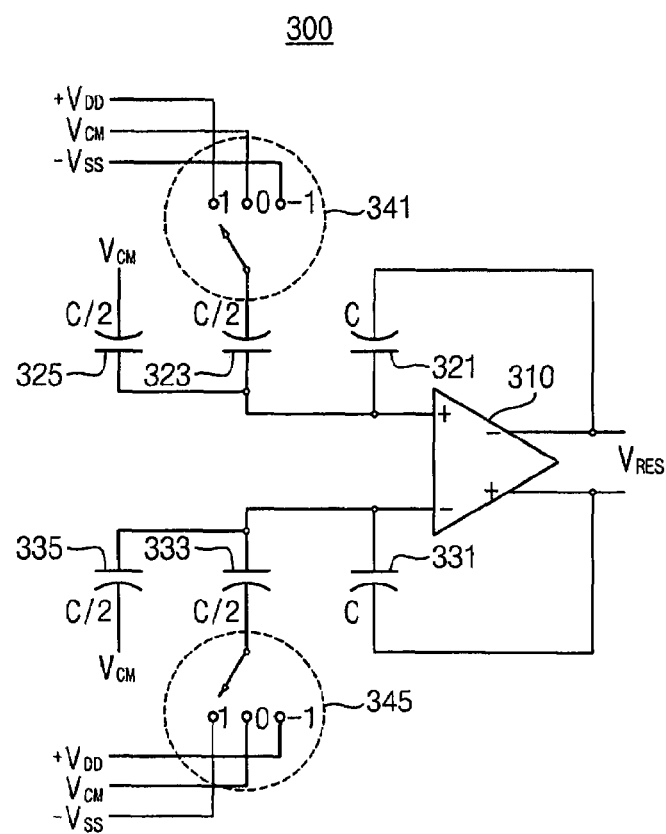

FIGS. 5A, 5B and 5C are circuit diagrams illustrating a 1.5 b MDAC without a reference voltage generator according to an example embodiment of the present invention. FIG. 5A is a circuit diagram including switches. FIG. 5B is a circuit diagram in which the switches are connected during a first clock phase. FIG. 5C is a circuit diagram in which the switches are connected during a second clock phase.

In FIGS. 5A, 5B and 5C, it is assumed that the power supply voltage VDD is 1.2V, the ground voltage VSS is 0V, the top reference voltage VRT is 0.9V, and the bottom reference voltage VRB is 0.3V. Then, the differential reference voltage VREF is 0.6V, and X is 1.5 according to Equation 1.

Referring to FIG. 5A, a 1.5 b MDAC 300 according to an example embodiment of the present invention includes a differential amplifier 310, a first switched capacitor circuit 320, and a second switched capacitor circuit 320. The first switched capacitor circuit 320 is coupled to a positive input terminal of the differential amplifier 310. The second switched capacitor circuit 330 is coupled to a negative input terminal of the differential amplifier 310. The first and second switched circuits include feedback capacitors 321 and 331 having a unit capacitance C, first capacitors 323 and 333 and second capacitors 325 and 335, respectively. The first capacitors 323 and 333 have a capacitance XC and the second capacitors 325 and 335 have a capacitance (1−X)C, respectively. Therefore, the first capacitors 323 and 333 and the second capacitors 325 and 335 have a capacitance of C/2, respectively, because X corresponds to ½ according to Equation 1. The first switched capacitor circuit 320 includes a plurality of switches 322, 324, 326, and 328. The second switched capacitor circuit includes a plurality of switches 332, 334, 336, and 338. A plurality of additional switches 341, 342, 343, 344, 345, 346, and 347 may also be included in the first and second switched capacitor circuits 320 and 330.

All of the switches are opened and closed in response to first and second switching control signals φ1 and φ2. Switches 324, 326, 328, 334, 336, 338, 343, 346, and 347 depicted with φ1 are closed during a first clock phase (input sampling period). Switches 322, 341, 342, 332, 344, and 345 depicted with φ2 are closed during a second clock phase (residue amplifying period).

FIGS. 5B and 5C are circuit diagrams in which the switches are selectively closed in response to the first and second switching control signals φ1 and φ2, respectively.

Referring to FIG. 5B, bottom plates of the capacitors 321, 323 and 325 are coupled to a positive input signal Vin+, and top plates of the capacitors 331, 323 and 325 are coupled to a common-mode level voltage VCM by the first switching control signal φ1. Bottom plates of the capacitors 333 and 335 are coupled to a negative input signal Vin−, and top plates of the capacitors 333 and 335 are coupled to VCM by the first switching control signal φ1. The positive output terminal and the negative output terminal of the differential amplifier 310 are coupled to each other. In this manner, the positive input signal Vin+ is stored in the capacitors 321, 323, and 325, and the negative input signal Vin− is stored in the capacitors 331, 333, and 335 during the first clock phase.

Referring to FIG. 5C, the bottom plates of the capacitors 321, 323 and 325 are disconnected from the positive input signal Vin+, and the bottom plates of the capacitors 331, 323 and 325 are disconnected from the negative input signal Vin− during the second clock phase. The bottom plates of the feedback capacitors 321 and 331 are coupled to the negative output terminal and the positive output terminal of the differential amplifier 310, respectively, during the second clock phase. The bottom plates of the first capacitors 323 and 333 are coupled to one of the power supply voltage, the ground voltage and the common-mode level voltage VCM, respectively, during the second clock phase. The bottom plates of the second capacitors 325 and 335 are coupled to the common-mode level voltage VCM during the second clock phase. Thus, charges corresponding to the positive input signal Vin+ and the negative input signal Vin− stored during the sampling period (that is, the first clock phase) are transferred to the feedback capacitors 321 and 323 during the residue amplifying period (that is, the second clock phase). Therefore, a reference voltage divider may be implemented by sampling the input signal voltage in capacitors divided at a certain ratio, and low power implementation may be accomplished because there is no static power consumption.

The first clock phase may correspond to an active period of a clock signal and the second clock signal may correspond to the inactive period of the clock signal. Alternatively the first clock phase may correspond to an inactive period of the clock signal and the second clock signal may correspond to the active period of the clock signal.

Figure 6A:
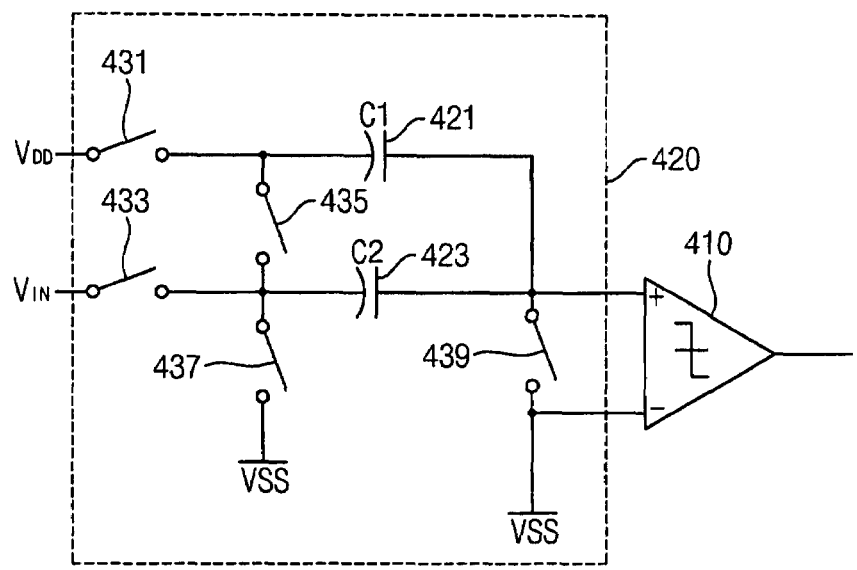
FIG. 6A is a circuit diagram illustrating a flash ADC using a power supply voltage divider in single-ended mode according to an example embodiment of the present invention.

FIG. 6A is a circuit diagram illustrating a flash ADC using a power supply voltage divider in single-ended mode according to an example embodiment of the present invention.

Figure 6B:
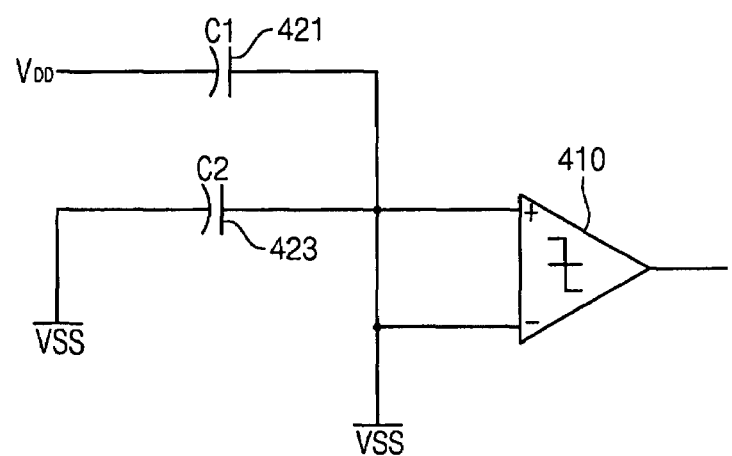
FIGS. 6B and 6C are circuit diagrams illustrating the flash ADC of FIG. 6A when the flash ADC of FIG. 6A samples a reference voltage, and compares the reference voltage with the input voltage, respectively.
Figure 6C:
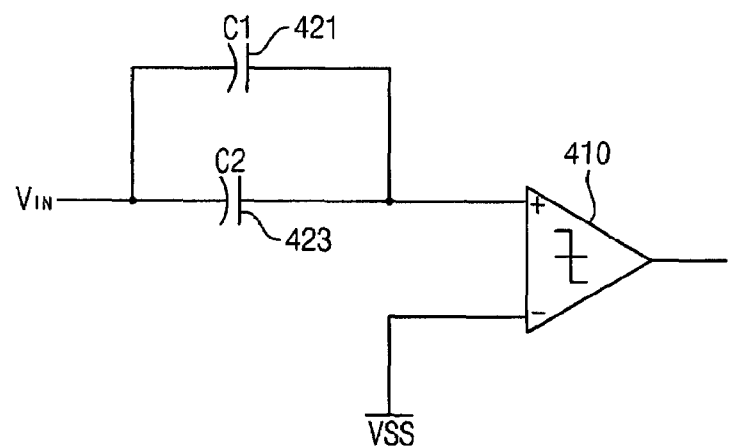

FIGS. 6B and 6C are circuit diagrams illustrating the flash ADC of FIG. 6A when the flash ADC of FIG. 6A samples a reference voltage, and compares the reference voltage with the input voltage, respectively.

Referring to FIG. 6A, a flash ADC 400 using the power supply voltage divider according to an example embodiment of the present invention includes a comparator 410 and capacitor circuit 420. The comparator 410 includes a positive input terminal, a negative input terminal coupled to a ground voltage, and an output terminal. The capacitor circuit 420 is coupled to the positive input terminal of the comparator 410. The capacitor circuit 420 includes a first sampling capacitor 421, and a second sampling capacitor 423. A top plate of the first sampling capacitor 421 is coupled to the positive input terminal of the comparator 410 and a bottom plate of the first sampling capacitor 421 is coupled to a switch 431. A top plate of the second sampling capacitor 423 is coupled to the positive input terminal of the comparator 410 and a bottom plate of the second sampling capacitor 423 is coupled to switches 433, 435 and 437. The switch 435 connects the bottom plate of the first sampling capacitor 421 and the bottom plate of the second sampling capacitor 423. The switch 439 connects the positive and negative input terminals of the comparator 410.

FIG. 6B illustrates that the flash ADC of FIG. 6A samples the reference voltage VSS using the power supply voltage VDD when the switches 431, 437 and 439 are closed.

FIG. 6C illustrates that the flash ADC of FIG. 6A compares the input voltage VIN with the reference voltage VSS when the switches 433 and 435 are closed. When the first sampling capacitor 421 has a capacitance of ANC (A and N are natural numbers, and C is a unit capacitance), and the second sampling capacitor 423 has a capacitance of (A(M−N)+BM)C (B and M are natural numbers), a voltage at the positive input terminal of the comparator 410 corresponds to VIN−A/(A+B)×N/M×VDD. The comparator 410 outputs 0 or 1 by comparing the ground voltage (0) with the voltage VIN−A/(A+B)×N/M×VDD. In view of the pipelined ADC, the flash ADC outputs 1 or 0 before the sampling phase is finished. The flash ADC of FIG. 6A may be also applied in a differential mode as a 1.5 b flash ADC of FIG. 8 that will be described below.

Figure 7:
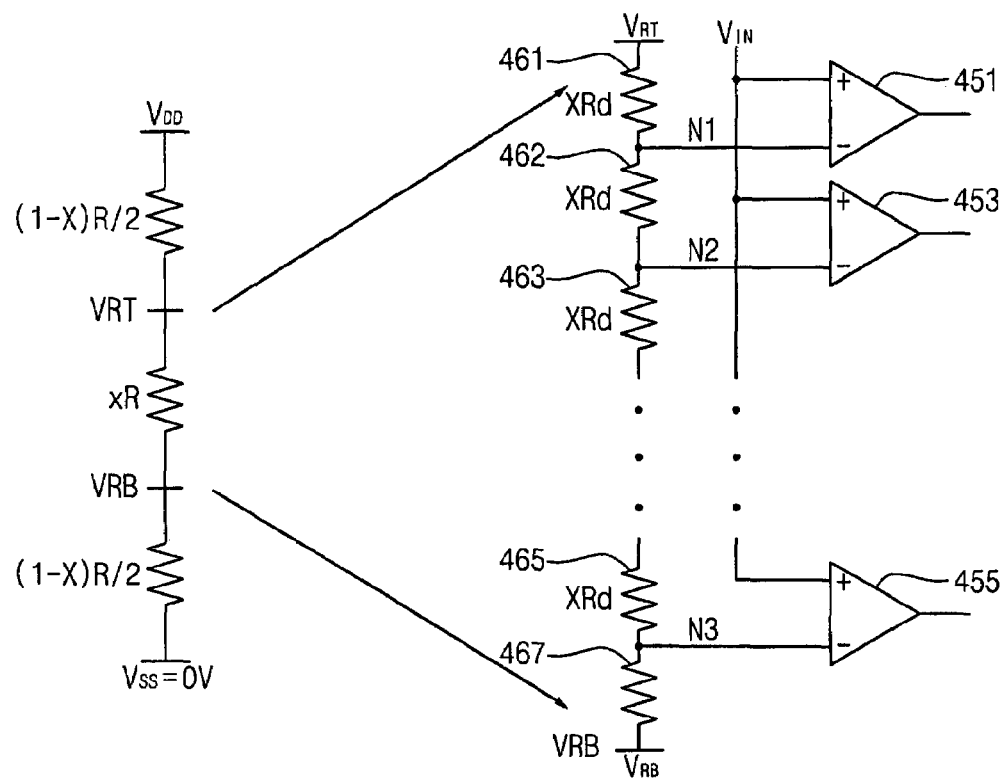
FIG. 7 is a circuit diagram illustrating a reference voltage that is generated from a power supply voltage VDD by using a resistor array divider.

FIG. 7 is a circuit diagram illustrating a reference voltage that is generated from a power supply voltage VDD by using a resistor array divider.

Referring to FIG. 7, the power supply voltage is divided into a reference voltage area XR and two extra areas (1−X) R/2, because of knowing a ratio of the reference voltage to the power supply voltage VDD. Then, a reference voltage of the ADC may be generated by uniformly dividing the reference voltage area XR. A plurality of resistors XRds having substantially the same resistance are connected in series between a top reference voltage VRT and a bottom reference voltage VRB. A comparator 451 outputs 1 or 0 according to a comparison result of the input voltage VIN and a voltage at a node N1. A comparator 453 outputs 1 or 0 according to a comparison result of the input voltage VIN and a voltage at a node N2.

A comparator 453 outputs 1 or 0 according to a comparison result of the input voltage VIN and a voltage at a node N3. In this case, the extra voltage area to the power supply voltage and the extra voltage area to the ground voltage need not be the same, because a center point of the reference voltage may be varied according to an input/output (I/O) common mode voltage suitable for designing.

Figure 8A:
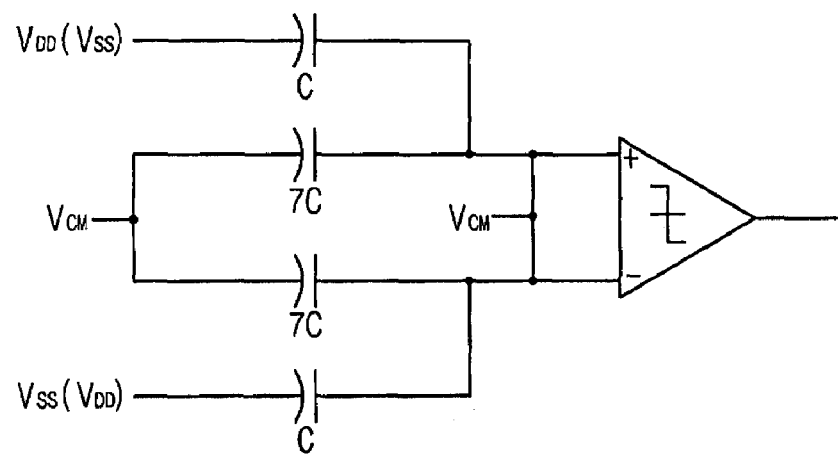
FIGS. 8A and 8B are circuit diagrams illustrating a 1.5 b flash ADC in a differential mode.
Figure 8B:
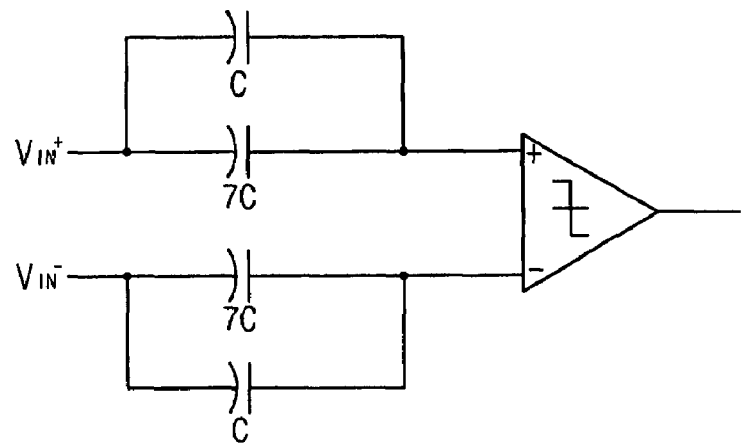

FIGS. 8A and 8B are circuit diagrams illustrating a 1.5 b flash ADC in a differential mode.

FIGS. 8A and 8B may be implemented on substantially the same conditions as those of FIGS. 6B and 6C, respectively, in the differential mode. In FIGS. 8A and 8B, A corresponds to 1, and B corresponds to 3. In addition, X corresponds to 0.5, and N/M corresponds to ½. Therefore, N corresponds to 1, and M corresponds to 2. Accordingly, the 1.5 b flash ADC may be implemented as FIGS. 8A and 8B.

Figure 9A:
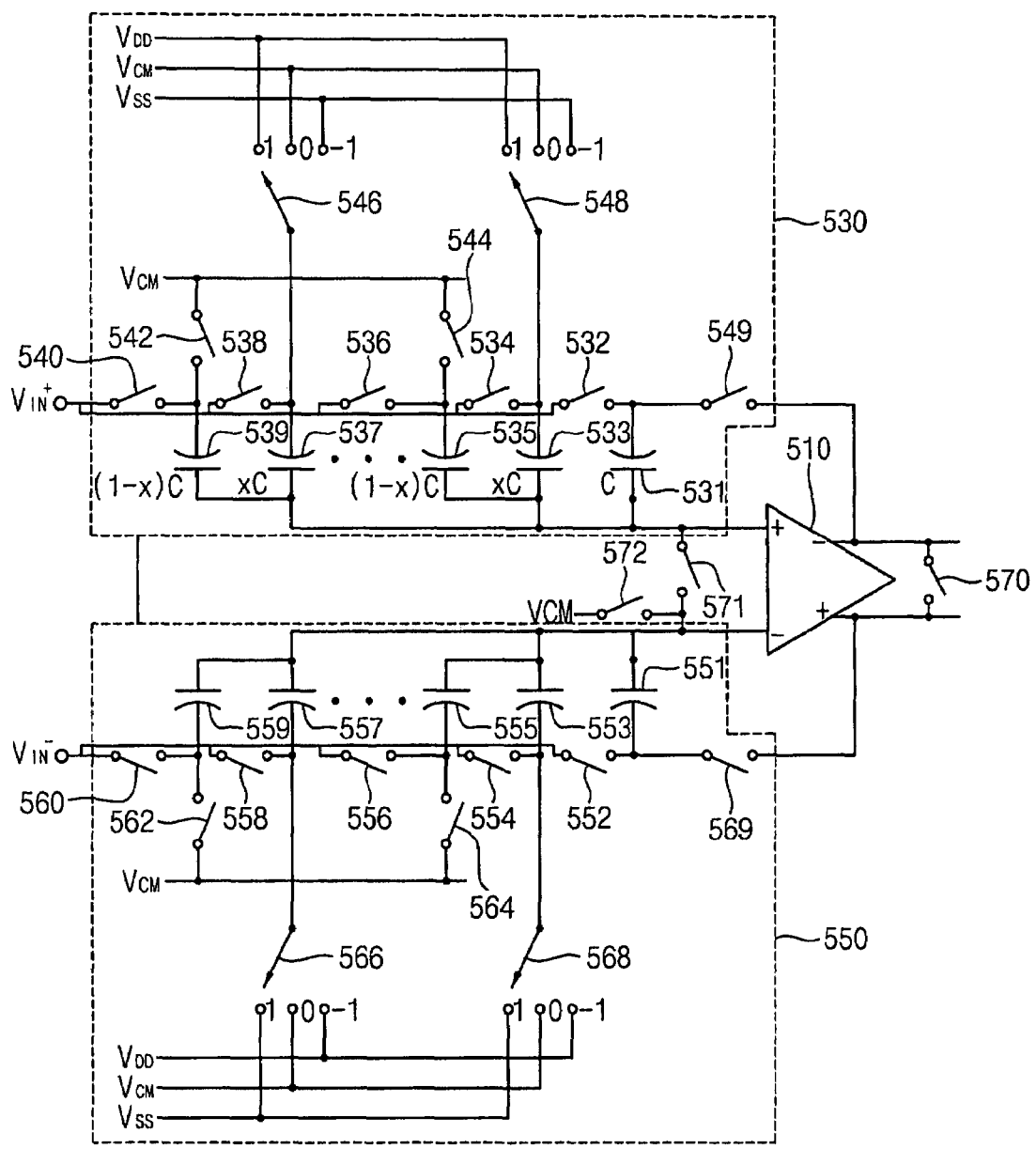
FIGS. 9A, 9B and 9C are circuit diagrams illustrating an MDAC using a capacitor divider.

FIG. 9A is a circuit diagram illustrating an MDAC using a capacitor divider. The MDAC of FIG. 9A may, for example, be employed in the pipelined ADC of FIG. 11.

Figure 9B:
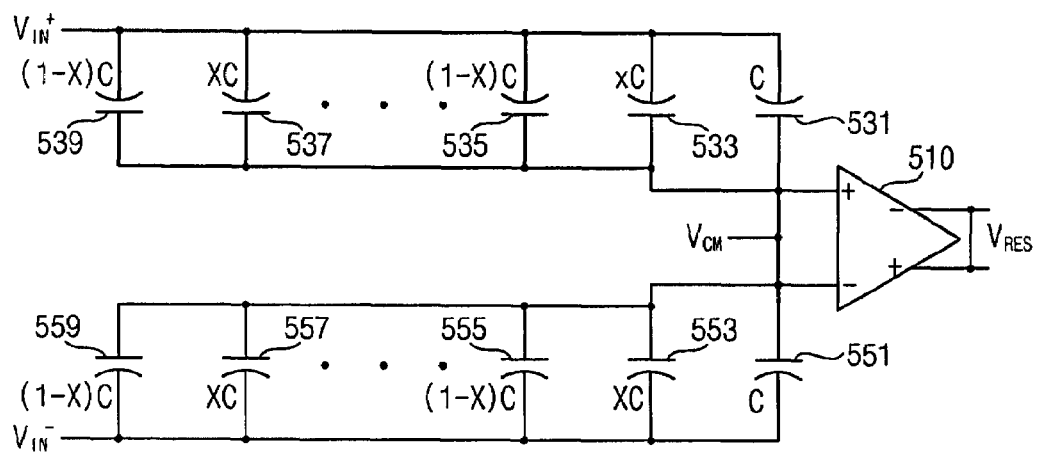
Figure 9C:
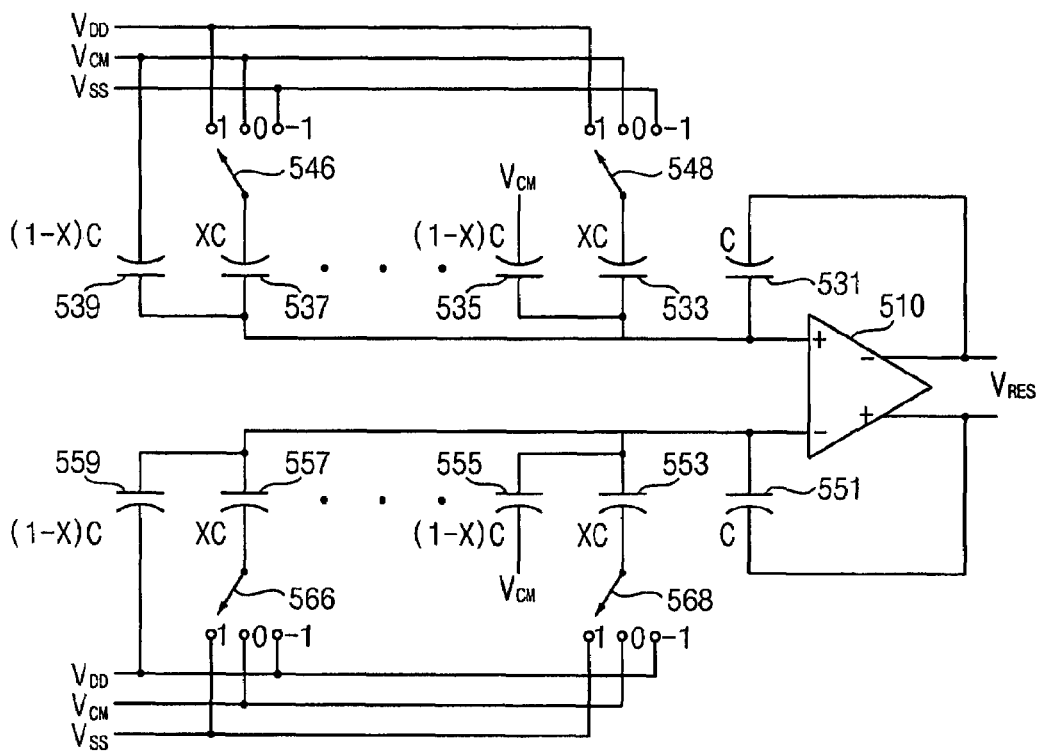

FIGS. 9B and 9C illustrate that switches are closed in a sampling period and a residue amplifying period of the MDAC of FIG. 9A, respectively.

Referring to FIG. 9A, an MDAC 500 according to an example embodiment of the present invention includes an amplifier 510, a first switched capacitor circuit 530 and a second switched capacitor circuit 550.

The first switched capacitor circuit 530 includes a feedback capacitor 531 having a unit capacitance C, and a plurality of sub-capacitors 533, 535, 537, and 539. The first sub-capacitors 533 and 537 have a capacitance XC. The second sub-capacitors 535, and 539 have a capacitance (1−X)C. Here, X is a positive real number that is greater than 0 and smaller than 1. The first switched capacitor circuit 530 includes a plurality of switches 546, 548, and 549.

The second switched capacitor circuit 550 includes a feedback capacitor 551 having a unit capacitance C, and a plurality of sub-capacitors 553, 555, 557, and 559. The first sub-capacitors 553 and 557 have a capacitance XC. The second sub-capacitors 555, and 559 have a capacitance (1−X)C. The first switched capacitor circuit 550 includes a plurality of switches 546, 548, and 549. A plurality of switches 570, 571 and 572 may be included in the first and second switched capacitors 530 and 550.

As illustrated in FIG. 9B, the switches 532, 534, 536, 538, and 540 are closed during a first clock phase, and thus a first input signal Vin+ is stored in the capacitors 531, 533, 535, 537, and 539 during the first clock phase. The switches 542, 544, 546, 548, and 550 are closed during the first clock phase, and thus a second input signal Vin− are stored in the capacitors 551, 553, 555, 557, and 559 during the first clock phase. The switches 571 and 572 are closed during the first clock phase. The switch 570 is closed during the first clock phase to reset the output of the amplifier 510.

As illustrated in FIG. 9C, the switches 532, 534, 536, 538, and 540 and the switches 542, 544, 546, 548, and 550 are opened during the second clock phase. In addition the switches 571 and 572 are opened during the second clock phase. The bottom plate of the feedback capacitors 531 and 551 are coupled to a negative output terminal and a positive output terminal of the amplifier 510, respectively, during the second clock phase. The second sub-capacitors 535 and 539 are coupled to the common-mode level voltage VCM, and the first sub-capacitors 533 and 537 are coupled to one of the power supply voltage VDD, the ground voltage VSS, and the common-mode level voltage VCM during the second clock phase. In addition, the second sub-capacitors 555 and 559 are coupled to the common-mode level voltage VCM, and the first sub-capacitors 553 and 557 are coupled to one of the power supply voltage VDD, the ground voltage VSS, and the common-mode level voltage VCM during the second clock phase. Therefore, the second sub-capacitors 535, 539, 555, and 559 transfer the stored charge corresponding to the input signals Vin+ and Vin− to the feedback capacitors 531 and 551 during the second clock phase. Accordingly, the amplifier 570 operates to subtract a DAC level corresponding to X(VDD−VSS).

Figure 10A:
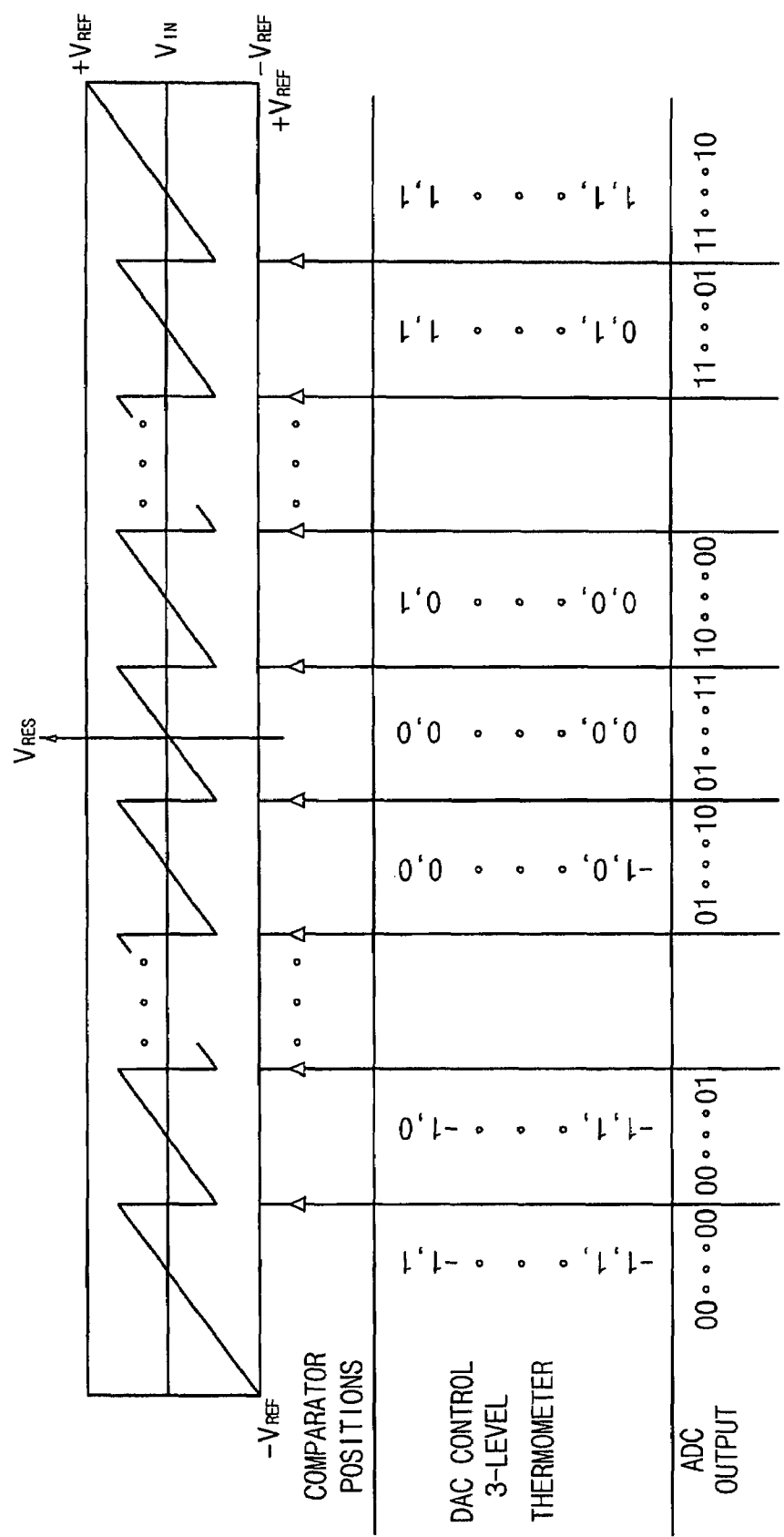
FIG. 10A is a graph illustrating input/output (I/O) characteristics of an ideal MDAC.
Figure 10B:
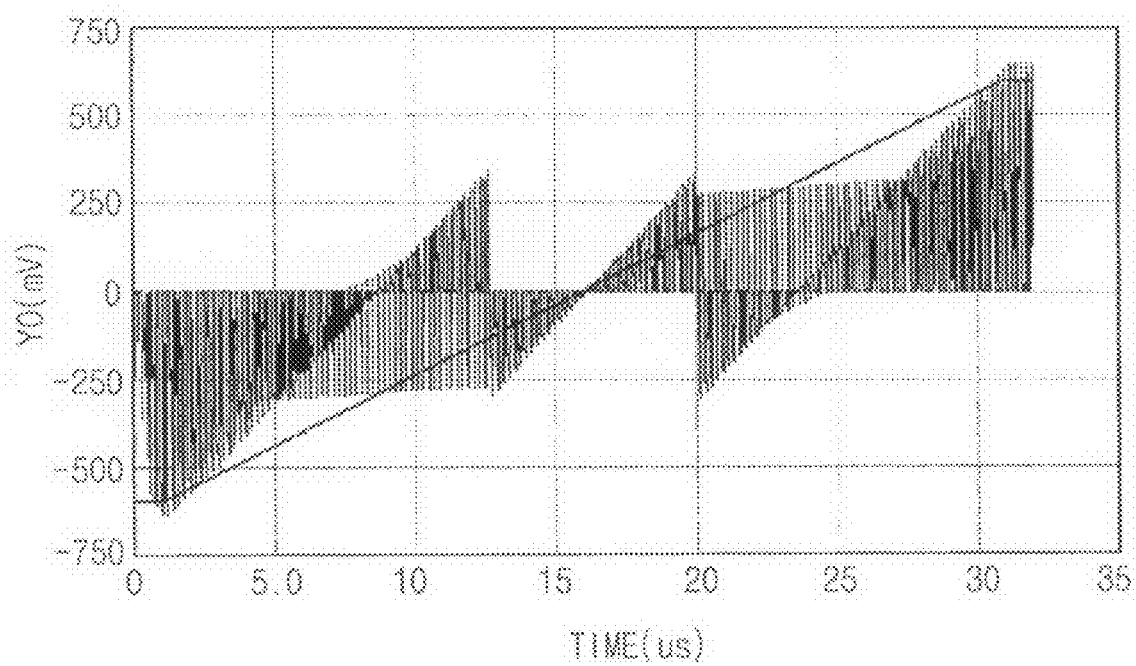
FIG. 10B is a graph illustrating I/O characteristics of the MDAC of FIG. 5A and the MDAC of FIGS. 8A and 8B according to example embodiments of the present invention.

FIG. 10A is a graph illustrating I/O characteristics of an ideal MDAC, and FIG. 10B is a graph illustrating I/O characteristics of the MDAC of FIG. 5A and the MDAC of FIGS. 8A and 8B according to example embodiments of the present invention. As an example, I/O characteristics of a first stage are illustrated in FIG. 10B.

An MDAC subtracts an analog representative value corresponding to an ADC output code from an analog input signal, amplifies a residue signal that remains from quantization, and delivers the amplified residue signal to the next stage. The next stage enhances a resolution by quantizing the residue signal.

Referring to FIG. 10A, triangles denote positions of reference voltages of a comparator of a low-resolution flash ADC included in each stage of a pipelined ADC. The flash ADC outputs a digital code ranging from 00 . . . 00 to 11 . . . 00 according to an input signal. A thermometer code is used in selecting reference voltages that are connected to the MDAC.

FIG. 10B is a simulation graph illustrating I/O characteristics of the MDAC of FIG. 5A and the MDAC of FIGS. 8A and 8B. As an example, I/O characteristics of the first stage are illustrated in FIG. 10B.

Referring to FIG. 10B, substantially ideal I/O characteristics as illustrated in FIG. 10A may be obtained when the pipelined ADC is implemented using a power supply voltage without the presence of, or need for, an extra reference voltage driver.

Figure 11:
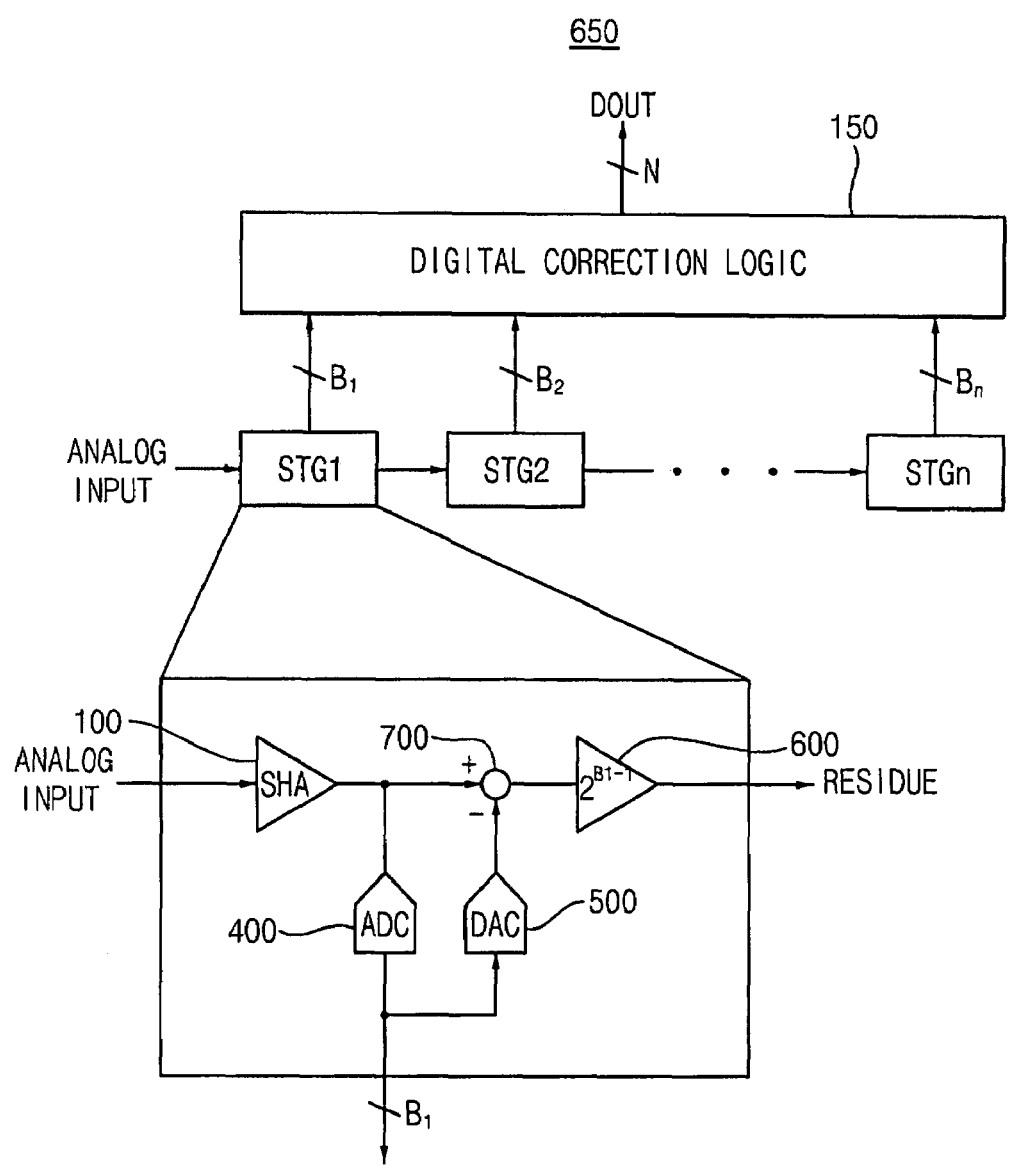
FIG. 11 is a circuit diagram illustrating a pipelined ADC having a multistage structure according to an example embodiment of the present invention.

FIG. 11 is a circuit diagram illustrating a pipelined ADC having a multistage structure according to an example embodiment of the present invention.

Referring to FIG. 11, a pipelined ADC having a multistage structure 650 according to an example embodiment of the present invention includes a plurality of stages (a multistage structure), and each of the stages includes a sample-and-hold (S/H) circuit 100, a flash ADC 400, a DAC 500, an amplifier 600, and a subtractor 700. The pipelined ADC having a multistage structure may further include a digital correction logic. The flash ADC 400 of FIG. 11 may correspond to the flash ADC of FIG. 6A, and the DAC 500 may correspond to the DAC of FIG. 5A. The pipelined ADC having a multistage structure according to an example embodiment of the present invention provides a reference voltage to the flash ADC 400 and the ADC 500 using the power supply voltage without an extra reference voltage driver.

In a method of analog-to-digital conversion, an analog input signal is received. The analog input signal is stored in a plurality of sub-capacitors. The sub-capacitors include a feedback capacitor, a first capacitor and a second capacitor, the feedback capacitor having a unit capacitance. The first capacitor has X times the unit capacitance, and the second capacitor, has (1−X) times the unit capacitance where X is a real number that is greater than 0 and less than 1. A digital bit corresponding to the analog input signal is detected. The digital signal is converted to an analog signal. The difference between the input analog signal and the converted analog signal is then amplified.

In one embodiment of the method detecting the digital bit involves sampling a reference voltage from a power supply voltage and a ground voltage. The sampled reference voltage and the analog input signal are then compared.

As mentioned above, the DAC, the flash ADC, the pipelined ADC, and the method of analog-to-digital conversion, according to example embodiments of the present invention may reduce chip size and power consumption because a necessary reference voltage is supplied internally. In addition, the reference voltage is automatically scaled according to the power supply voltage, and thus a dynamic range does not require an external control when the power supply voltage is changed.

While the example embodiments of the present invention and their advantages have been described in detail, it should be understood that various changes, substitutions and alterations may be made herein without departing from the scope of the invention.

What is claimed is:

1. A multiplying digital-to-analog converter (MDAC) comprising:
    an amplifier that includes differential input terminals and differential output terminals;
    a first switched capacitor circuit coupled to a positive input terminal of the differential input terminals; and
    a second switched capacitor circuit coupled to a negative input terminal of the differential input terminals, each of the first and second switched capacitor circuits comprising:
        a feedback capacitor having a unit capacitance;
        a first capacitor that has a first capacitance, and includes a first common terminal coupled to a common terminal of the feedback capacitor and one of the differential input terminals;
        a second capacitor that has a second capacitance, and includes a second common terminal coupled to the common terminal of the feedback capacitor and one of the differential input terminals, the first capacitance corresponding to X times the unit capacitance, the second capacitance corresponding to (1−X) times the unit capacitance where X is a real number that is greater than 0 and less than 1; and
        a plurality of switches that connect input terminals of all of the capacitors to an analog differential input signal, and connect the differential input terminals to a common mode voltage during a first phase of a clock, and that disconnect the common mode voltage from the differential input terminals, connect an input terminal of the feedback capacitor to one of the differential output terminals, connect a first input terminal of the first capacitor to one of first, second and third reference voltages, and connect a second input terminal of the second capacitor to the second reference voltage during a second phase of the clock.

2. The MDAC of claim 1, wherein the first, second, and third reference voltages are driven from a power supply source.

3. The MDAC of claim 2, wherein the first reference voltage corresponds to a power supply voltage, the second reference voltage corresponds to a ground voltage, and the third reference voltage ranges from the second reference voltage to the first reference voltage.

4. The MDAC of claim 3, wherein the common mode voltage corresponds to the second reference voltage.

5. The MDAC of claim 4, wherein the differential outputs of the amplifier are connected to each other during the first phase of the clock.

6. A flash analog-to-digital converter (ADC) comprising:
a comparator including a first input terminal coupled to a ground voltage; and
a capacitor circuit coupled to a second input terminal of the comparator, the capacitor circuit comprising:
   a first sampling capacitor having a first common terminal coupled to the second input terminal of the comparator;
   a second sampling capacitor having a second common terminal coupled to the second input terminal of the comparator and to the first common terminal of the first sampling capacitor; and
   a plurality of switches that perform switching operations for comparing an analog input signal with a reference voltage after a power supply voltage is stored in the first sampling capacitor, wherein the plurality of switches connect the power supply voltage to a first input terminal of the first sampling capacitor, connect the around voltage to a second input terminal of the second sampling capacitor, and connect the power supply voltage in the first sampling capacitor by connecting the first and second input terminals of the comparator with each other.

7. The flash ADC of claim 6, wherein the plurality of switches compare the analog input signal with the reference voltage by connecting the analog input signal to the first input terminal of the first sampling capacitor and the second input terminal of the second sampling capacitor.

8. The flash ADC of claim 7, wherein the reference voltage has a voltage level corresponding to A/(A+B) times a voltage level of the power supply voltage when the first sampling capacitor has A times a unit capacitance, and the second sampling capacitor has B times the unit capacitance, A and B being positive real numbers.

9. A pipelined ADC having a multistage structure, the pipelined ADC comprising:
a plurality of stages that form the multistage structure, each of the stages comprising:
   a sample-and-hold (S/H) circuit that converts an analog input signal to a digital signal;
   a flash ADC that detects a digital bit corresponding to the analog input signal; and
   a DAC that converts the digital signal to an analog signal, and amplifies a residue signal, which is a difference between the input analog signal and the converted analog signal, that is provided as an analog input signal of the next stage, the DAC including:
      an amplifier that includes differential input terminals and differential output terminals;
      a first switched capacitor circuit coupled to a positive input terminal of the differential input terminals; and
      a second switched capacitor circuit coupled to a negative input terminal of the differential input terminals, each of the first and second switched capacitor circuits including:
         a feedback capacitor having a unit capacitance;
         a first capacitor that has a first capacitance, and includes a first common terminal coupled to a common terminal of the feedback capacitor and one of the differential input terminals;
         a second capacitor that has a second capacitance, and includes a second common terminal coupled to the common terminal of the feedback capacitor and one of the differential input terminals, the first capacitance corresponding to X times the unit capacitance, the second capacitance corresponding to (1−X) times the unit capacitance where X is a real number that is greater than 0 and less than 1; and
         a plurality of switches that connect input terminals of all of the capacitors to an analog differential input signal, and connect the differential input terminals to a common mode voltage during a first phase of a clock, and that disconnect the common mode voltage from the differential input terminals, connect an input terminal of the feedback capacitor to one of the differential output terminals, connect a first input terminal of the first capacitor to one of first, second and third reference voltages, and connect a second input terminal of the second capacitor to the second reference voltage during a second phase of the clock.

10. The pipelined ADC of claim 9, wherein the first, second, and third reference voltages are driven from a power supply source.

11. The pipelined ADC of claim 10, wherein the first reference voltage corresponds to a power supply voltage, the second reference voltage corresponds to a ground voltage, and the third reference voltage ranges from the second reference voltage to the first reference voltage.

12. The pipelined ADC of claim 11, wherein the common mode voltage corresponds to the second reference voltage.

13. The pipelined ADC of claim 12, wherein the differential outputs of the amplifier are connected to each other during the first phase of the clock.

14. The pipelined ADC of claim 9, wherein the flash ADC comprises:
   a comparator including a first input terminal coupled to a ground voltage; and
   a capacitor circuit coupled to a second input terminal of the comparator.

15. The pipelined ADC of claim 14, wherein the capacitor circuit comprises:
   a first sampling capacitor having a first common terminal coupled to the second input terminal of the comparator;
   a second sampling capacitor having a second common terminal coupled to the second input terminal of the comparator and to the first common terminal of the first sampling capacitor; and
   a plurality of switches that perform switching operations for comparing an analog input signal with a reference voltage after a power supply voltage is stored in the first sampling capacitor.

16. The pipelined ADC of claim 15, wherein the plurality of switches connect the power supply voltage to a first input terminal of the first sampling capacitor, connect the ground voltage to a second input terminal of the second sampling capacitor, and connect the power supply voltage in the first sampling capacitor by connecting the first and second input terminals of the comparator with each other.

17. The pipelined ADC of claim 16, wherein the plurality of switches compare the analog input signal with the reference voltage by connecting the analog input signal to the first input terminal of the first sampling capacitor and the second input terminal of the second sampling capacitor.

18. The pipelined ADC of claim 9, further comprising a digital correction logic that corrects errors of the digital bits output from each of the plurality of stages.

19. A method of analog-to-digital conversion, comprising:
receiving an analog input signal;
storing the analog input signal in a plurality of sub-capacitors that include a feedback capacitor, a first capacitor and a second capacitor, the feedback capacitor having a unit capacitance, the first capacitor having X times the unit capacitance, the second capacitance having (1−X) times the unit capacitance where X is a real number that is greater than 0 and less than 1;

detecting a digital bit corresponding to the analog input signal;

converting the digital signal to an analog signal; and amplifying a difference between the input analog signal and the converted analog signal.

20. The method of claim 19, wherein detecting the digital bit comprises:

sampling a reference voltage from a power supply voltage and a ground voltage; and comparing the sampled reference voltage and the analog input signal.

* * * * *

UNITED STATES PATENT AND TRADEMARK OFFICE
CERTIFICATE OF CORRECTION

PATENT NO. : 7,515,086 B2
APPLICATION NO. : 11/879675
DATED : April 7, 2009
INVENTOR(S) : Seung-Tak Ryu Page 1 of 1

It is certified that error appears in the above-identified patent and that said Letters Patent is hereby corrected as shown below:

Column 11, line 19 delete "around" and insert --ground--

Signed and Sealed this

Fourteenth Day of July, 2009

JOHN DOLL
*Acting Director of the United States Patent and Trademark Office*